Feb. 16, 1971 R. GERMANN 3,564,442
INTEGRATED FIELD-EFFECT DISTRIBUTED AMPLIFIER
Filed Feb. 13, 1969 4 Sheets-Sheet 1

Inventor
Reimar Germann
By
Watson, Cole, Grindle + Watson
Attys.

Inventor
Reimar Germann
By
Watson, Cole, Grindle & Watson
Attys.

Inventor
Reimar Germann
By
Watson, Cole, Grindle + Watson
Attys.

Inventor
Reimar Germann
By
Watson, Cole, Grindle & Watson
Attys.

United States Patent Office 3,564,442

Patented Feb. 16, 1971

3,564,442

INTEGRATED FIELD-EFFECT DISTRIBUTED AMPLIFIER

Reimar Germann, Graz, Austria, assignor to Hans List, Graz, Austria

Filed Feb. 13, 1969, Ser. No. 798,878
Claims priority, application Austria, July 30, 1968, A 7,441/68
Int. Cl. H03f 3/16
U.S. Cl. 330—35 1 Claim

ABSTRACT OF THE DISCLOSURE

An integrated field-effect type distributed amplifier having a transistor with a drain electrode and two isolated gates to form homogenous networks and termination resistances. The amplifier also includes connections for the termination resistance connected to delay lines.

The invention relates to a distributed amplifier of the integrated variety based upon the field-effect.

It is an object of the invention to provide an amplifier with a field-effect transistor, a drain electrode and leakage and capacitance coatings which are homogeneously distributed among the networks. Further objects of the invention resides in the first of the networks which are connected to the first gate and to the surface electrode of the field-effect transistor. Further a termination resistance is provided connecting the characteristic impedance of the input delay line and connected to the end thereof and a second of the networks are connected with the field-effect transistor. One of the termination resistances corresponds to the characteristic impedance and the amplitude voltage wave is taken from the end of the output delay line which is further distant from the input of the distribued amplifier.

Further objects of the invention will be apparent from the following description when considered in connection with the accompanying drawings in which.

Figure 1:
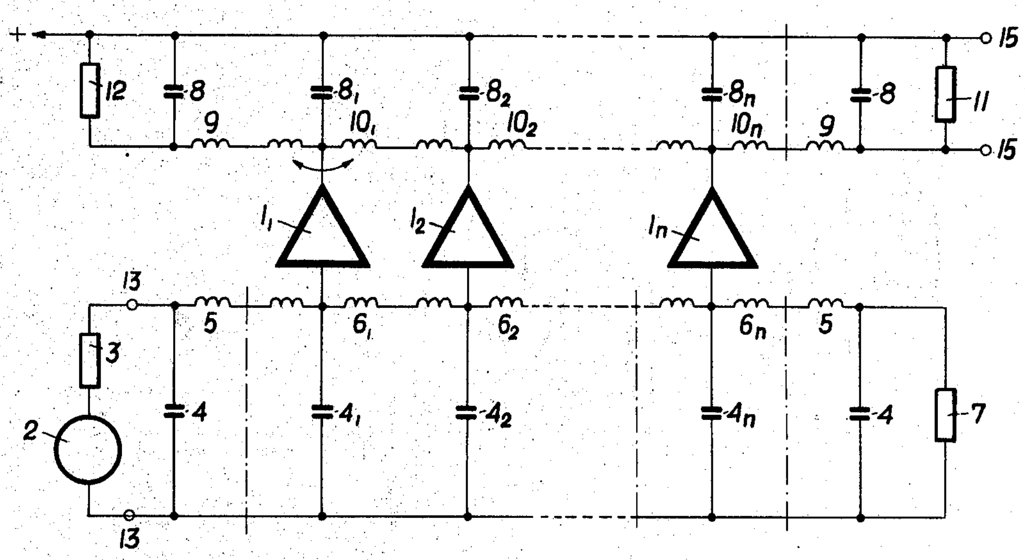
FIG. 1 is a circuit diagram of a distributed amplifier.

For the amplification of frequency bands of maximum band width, Percival disclosed a circuitry in 1936 (British patent specification 464,977) interconnecting individual active amplifier elements (vacuum tubes) in such a manner that the parasitic capacitances of the input and output have no broad-band-limiting effect. The basic circuit diagram of such a distributed amplifier is shown in FIG. 1. The inputs and outputs of the amplifier elements $1_1$ thru $1_n$ are connected in parallel both via an artificial balancing line designed as a network in the present instance. The input and output capacitances of the amplifier elements $1_1$ thru $1_n$ are component parts of the network. Consequently, the band width of the amplifier is determined by the cut-off frequency. The networks are preferably constructed from half-sections comprising the capacitance 4 and the inductance 5 which are complemented at the inputs and outputs of the amplifier elements so as to become full sections. The capacitances $4_1$ thru $4_n$ at the input and the capacitances $8_1$ thru $8_n$ at the output are the parasitic capacitances of the input and output of the amplifier elements. The constant phase velocity required of a distributed amplifier is preferably achieved by the use of $m$-half sections having a transformation factor of $m=1.27$. The negative inductance required for the transformation factor $m=1.27$ is obtained by incorporating a mutual inductance 6, thru $6_n$ and 10 thru $10_n$ respectively.

A wave coming in at the input terminals 13 will produce a change in driving voltage consecutively in each amplifier element $1_1$ thru $1_n$. At the end of the input delay line terminated by the characteristic impedance $Z=\sqrt{L/C}$ the incoming wave is reflectionlessly absorbed. As a result of this incoming wave changes in output magnitude will also occur consecutively at the output end. In the event of complete conformity of the phase velocities of these sections the waves traveling on both sides will add at the terminating resistance 11 of the output end delay line. The waves traveling to the left are absorbed by the terminating resistance 12 which should equal the characteristic impedance of the output delay line. The total gain of such a distributed amplifier equals the total gain of all stages.

$$A_K=nA_S$$

n—Number of stages $A_S$—Gain of any one stage

Figure 2:
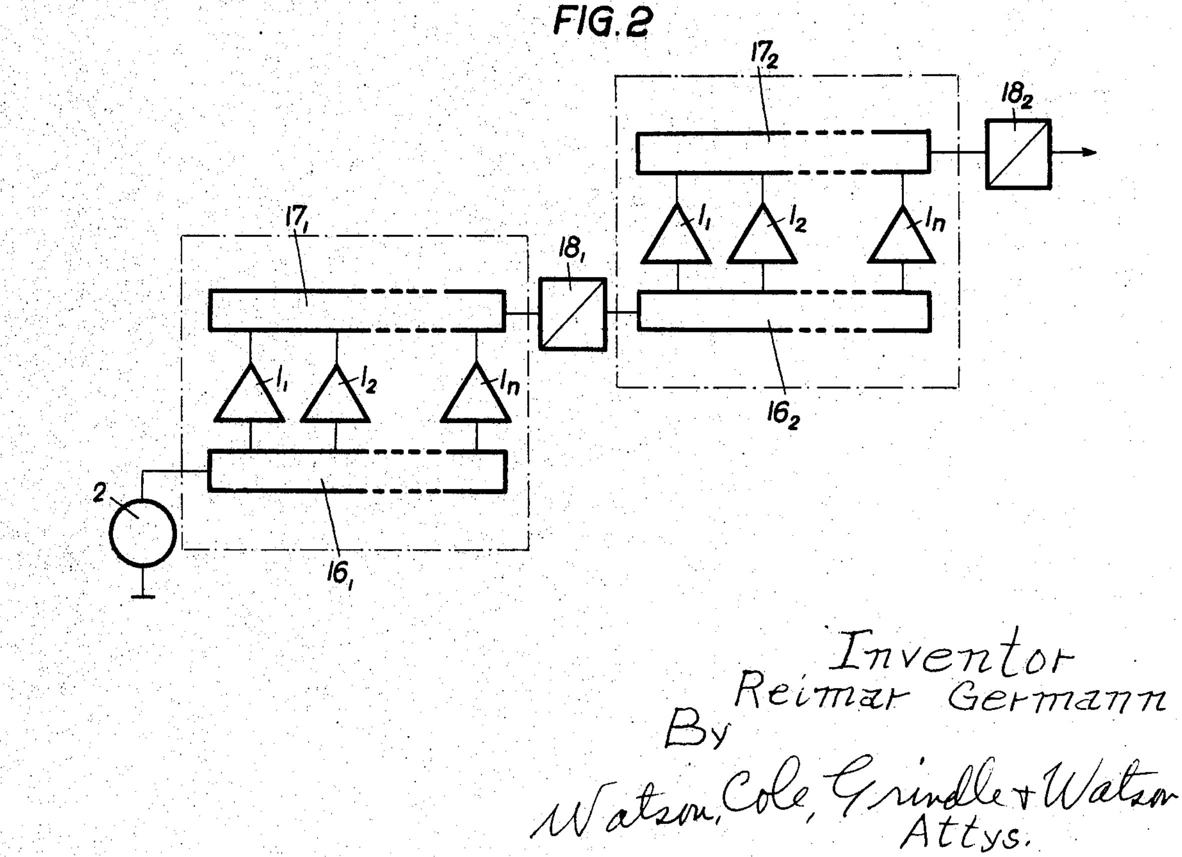
FIG. 2 is a cascade circuit for greater amplification.

This goes to show that the overall amplification of a distributed amplifier of this type only equals the total of the individual gains of the various amplifier elements. In order to achieve adequate amplification, it is therefore, necessary to use a large number of vacuum tubes in such a network. On account of the inevitable transmission loss within the delay line it is, however, impossible to increase the number of stages of the amplifier elements at will. If greater amplification is required, a cascade circuit comprising a number of these lines can be used as shown in FIG. 2. The input voltage source 2 feeds the input delay line $16_1$ of the first distributed amplifier comprising the amplifier elements $1_1$ thru $1_n$. For adaptation, the output delay line $17_1$ is connected to the input delay line of the second distributed amplifier via an impedance transformer $18_1$. The construction of the second distributed amplifier is absolutely the same as that of the first. The second distributed amplifier comprises the input delay line $16_2$, the amplifier elements $1_1$ thru $1_n$ and the output delay line $17_2$. For further adaptation to the characteristic impedance of the next cascade step or of the output, another impedance transformer $18_2$ is provided. This goes to show that a very large number of structural elements are required. For the total gain of this type of cascade distributed amplifier the following formula applies:

$$A=(n_1A_{S1})(n_2A_{S2})(n_3A_{S3})$$

which shows that the total gain equals the product of the total gain $A_K$ of the individual distributed amplifiers.

Owing to the absolute necessity of decoupling the output circuit from the input circuit it is not possible to use bipolar transistors for the design of a distributed amplifier. Furthermore, a bipolar transistor has an input resistance with a high degree of dependence on frequency and is capable of considerable reaction upon the input. Using field-effect transistors it is now possible to build up a distributed amplifier, provided the input circuit and the output circuit are effectively decoupled. This can be done in a manner known per se either by means of a source coupling or else by means of two field-effect transistors in cascade connection. The use of modern field-effect transistors with isolated gates (MOSFET) comprising two separate gates provides a structural element capable of directly effecting positive decoupling. This structural element which can also be made by the integrated technique, is very much superior to the electron tube (pentode). This superiority results in greater forward conductance and a lower input conductance usually attainable by means of electrometer tubes only. It is quite easy to manufacture a distributed amplifier having MOSFET's with two isolated gates, although it is hardly possible to make them by the monolithic technique owing to the difficulty of producing inductances at reasonable cost. Above all it is impossible to produce a mutual inductance of the type required for $m$-transformed half-sections with a transformation factor of $m=1.27$.

Figure 3:
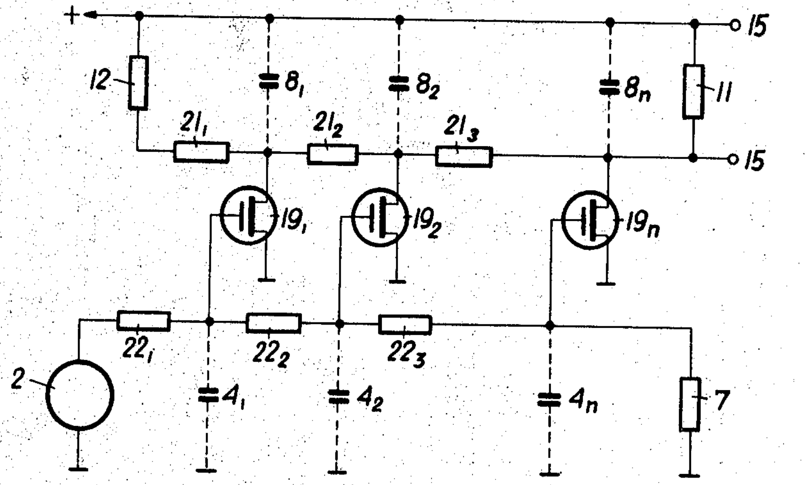
FIG. 3 is a circuit showing a distributed amplifier.

It is also possible to build up a delay line with the use of R and C sections. The advantage of an RC delay line resides in the fact that the resistances are very easily obtainable by the monolithic technique. FIG. 3 shows a distributed amplifier using MOSFET's and an RC network as an input delay line and as an output delay line. The delay line consists of the parasitic capacitances of the inputs and outputs $4_1$ and $8_1$ thru $4_n$ and $8_n$ serving as effective capacitances of the delay line. The delay lines proper terminates in the characteristic impedances 7, 11, 12 in order to avoid reflexion. Provided the group velocity is the same, the following formula applies:

$$\epsilon jb_1=\epsilon jb_2$$

$\epsilon$—base of natural logarithums=2,718
$j=\sqrt{-1}$
$b$—phase constant and consequently $$R_1C_1=R_2C_2$$

R—resistance
C—capacitance with a small number of stages $n$ and provided transmission loss is negligible, the following formula applies to the amplification:

$$A=n\frac{G_{12}}{2}|Z_1|$$

A—gain
Z—complex characteristic impedance
$n$—number of stages
$G_{12}$—forward conductance With a larger number of stages it is, however, no longer possible to neglect the transmission loss, so that when taking the characteristic impedance into account, the following formula applies to the amplification:

$$A=\frac{G_{12}}{4}\sqrt{\omega\frac{R_1}{C_1}}\sqrt{2+j\omega R_1C_1}\left|\frac{1-e^{-na}}{\sinh a/2}\right|$$

$\omega$—angular frequency $2\pi f$
$a$—attenuation constant
sinh—hyperbolic sine This goes to show that where the absence of any inductance is complete, trouble is liable to arise when closing the line due to the dependence of the characteristic impedance on frequency and transmission loss. The effective capacitances of this delay line are not shown in the drawing and it will be seen that this circuitry is very easy to produce by monolithic technique, since it comprises resistances and active amplifier elements (MOSFET's) only. The input delay line consists of the series resistances $22_1$ thru $22_n$ and the input capacitances $4_1$ thru $4_n$ not shown in FIG. 4 of the drawings. The input delay line terminates with its characteristic impedance 7. The output delay line consists of the series resistances $22_1$ thru $22_n$ and the output capacitances of the MOSFET's $8_1$ thru $8_n$ not shown in FIG. 4 of the drawings. The output delay line terminates at both ends with its characteristic impedance 11, 12. A voltage divider 22, 23 serves to maintain an accurate potential for the second gate in order to avoid any reaction by the output circuit upon the input circuit. In the arrangement illustrated in the drawing all source connections are interconnected and the source electrode can be obtained by means of a single $n^+$ diffusion zone. The connection of GATE 2 is no less simple.

Figure 4:
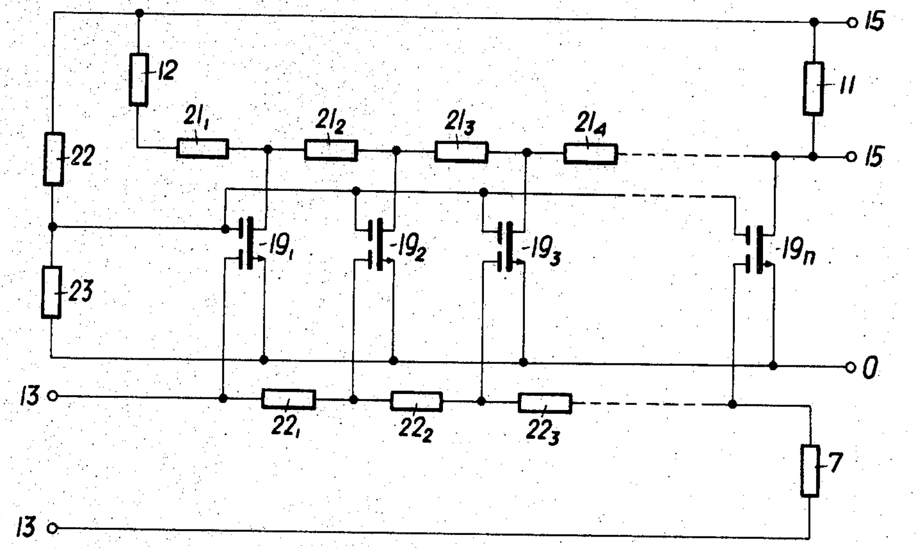
FIG. 4 is a circuit diagram showing an input delay line.
Figure 5:
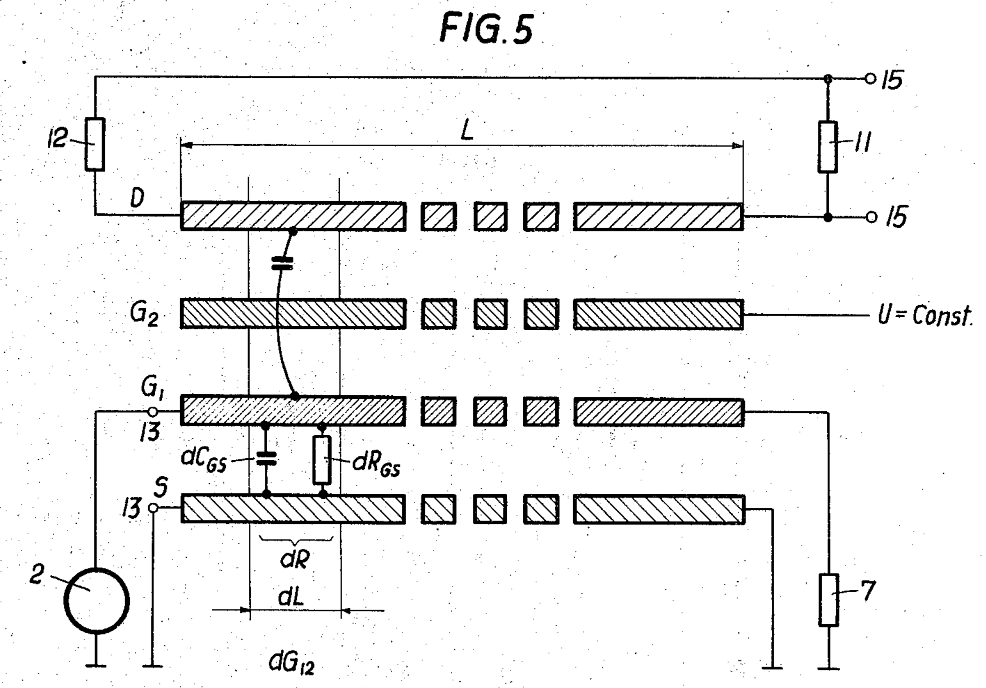
FIG. 5 is a circuit diagram showing differential capacitance and series resistances.

The invention is based on the fact that in accordance with the circuitry shown in FIG. 4 for a distributed amplifier with an RC-network, a cable is obtained with a homogeneously distributed RC-coating. By the continuous interconnection of minimum-size elements $dl$ of a MOSFET as shown in FIG. 5, with the differential capacitances $dC_{GS}$ and differential series resistances $dR_L$ and leak resistances $dR_{GS}$ a homogenous network as viewed over the entire length L is obtained. In view of its construction, every single element $dl$ acts as an amplifier element with the differential forward conductance $dG_{12}$. This input line terminates at its end with the characteristic impedance 7 and on the output line which is also composed of the differential resistances and capacitances, the amplified signals add up at the termination resistance 11 depending on the total of the differential conductance $dG_{12}$ over the length L.

By the insertion of a second gate $G_2$ maintained on a constant potential which is positive as compared with $G_1$, between gate $G_1$ and the drain electrode D, any reaction by the output circuit upon the input circuit is largely suppressed. The construction of such an element by the integrated technique as a MOSFET or else by the thin-film technique is extremely easy.

Figure 7:
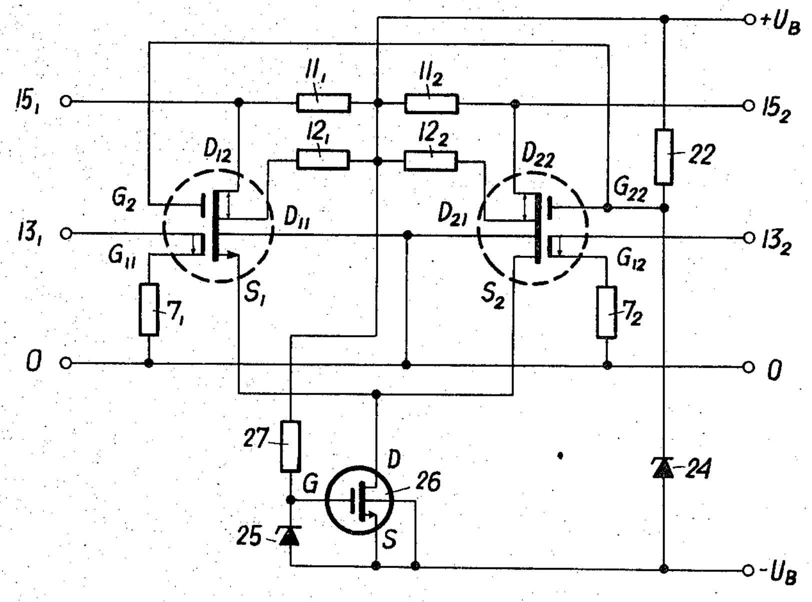
FIG. 7 is a circuit diagram of an integrated differential field-effect distributed amplifier.
Figure 6:
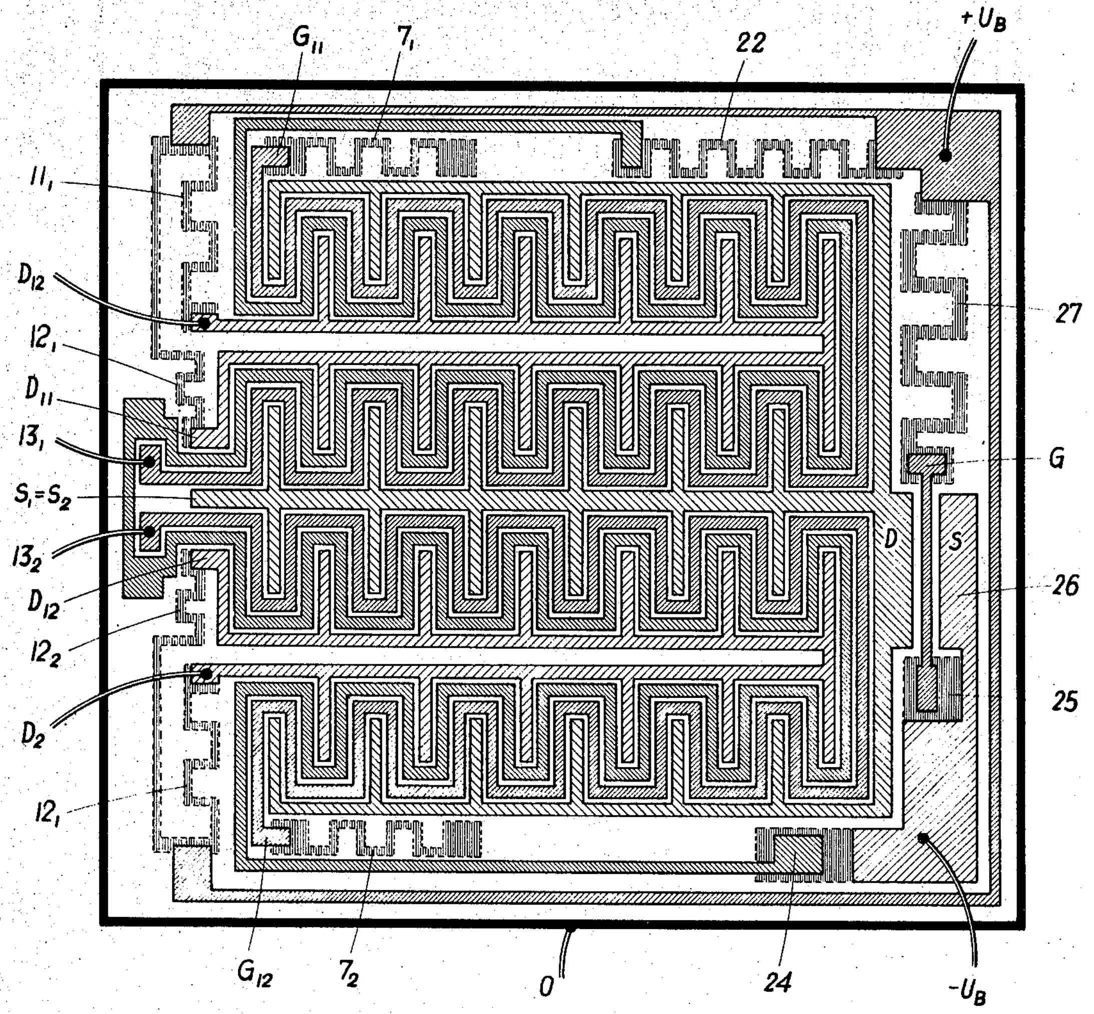
FIG. 6 is a topological design representation.

FIG. 6 shows the topological design and FIG. 7 the wiring diagram of an integrated differential field-effect distributed amplifier according to the invention showing its particularly simple construction.

In order to obtain a network of maximum length featuring a high total gain, a meander-shaped arrangement is preferable. In the embodiment of the invention shown in the drawing, the termination resistances 7, 11 and 12 are applied on the same substrate by diffusion with an isolating diffusion layer as is the resistance 22 required for the production of a constant voltage for the gate 2, and the Zener-diode 24. In order to achieve a suitable common mode a MOSFET 26 acting as a common source resistance is provided in a manner known per se in a constant-current circuit and likewise applied to the same substratum. The constant-current effect is obtained by maintaining the gate G of the MOSFET 26 on a constant potential. This is achieved by means of the resistance 27 and the Zener-diode 25 which is also produced by diffusion on the same substratum. The MOSFET 26 is preferably designed as an enhancement-type field-effect transistor with a diode characteristic whose threshold voltage equals the Zener-voltage of the Zener-diode 25. The correlation of the various elements in the topological design is explained by the identicity of reference number in FIGS. 6 and 7, respectively. It goes without saying that any conventional method can be used for the manufacture of MOSFET's and thin-film transistors.

According to a further embodiment of the invention it is possible to alter the forward conductance by continuous modification of the channel dimensions of the field-effect semiconductor in such a manner that transmission loss due to series resistance is suppressed.

A serious connection of a plurality of integrated field-effect distributed amplifiers similar to the circuitry shown in FIG. 2 is quite possible, thereby multiplying the gain factor. By using opposite polarities the output potential becomes equal to the input potential resulting in a substantial simplification of construction.

I claim:

1. An integrated field-effect type distributed amplifier comprising a field-effect transistor having a source electrode, a drain electrode and a first and a second isolated gate, the channel length of the said field-effect transistor being extended to form homogeneous networks, resistance, leakage and capacitance coatings homogeneously distributed among the said networks, the first of the said networks connected to the first gate and to the source electrode of the said field-effect transistor, thereby forming the input delay line of the distributed amplifier, the voltage wave to be amplified being applied between the first gate and the source electrode, a termination resistance coinciding with the characteristic impedance of the said input delay line and connected to the end thereof, the said second isolated gate being connected to a source of constant potential, the second of the said networks being connected to the drain electrode and the first gate of the said field-effect transistor, thus forming the output delay line of the distributed amplifier, one termination resistance each corresponding to the characteristic impedance of the said output delay line connected to both ends of the output delay line, the amplified voltage wave to be taken from the end of the output delay line which is farther distant from the input of the distributed amplifier.

References Cited

UNITED STATES PATENTS 3,454,894 7/1969 Voorhoeve --------- 330—38X

OTHER REFERENCES

Jessel et al.: "An Amplifier Design Using MOS Transistors," Proceedings of the IEEE, November 1966, pp. 1581, 1582.

McIver: "A Traveling-Wave Transistor," Proceedings of the IEEE, November 1965, pp. 1747, 1748.

ROY LAKE, Primary Examiner

J. B. MULLINS, Assistant Examiner

U.S. Cl. X.R.

330—30, 38, 54